US011217874B2

United States Patent
Balboni et al.

(10) Patent No.: US 11,217,874 B2
(45) Date of Patent: Jan. 4, 2022

(54) SILICON CAVITY BACKED RADIATOR STRUCTURE

(71) Applicant: Analog Devices, Inc., Norwood, MA (US)

(72) Inventors: Ed Balboni, Littleton, MA (US); Ozan Gurbuz, Portland, OR (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/822,866

(22) Filed: Mar. 18, 2020

(65) Prior Publication Data

US 2020/0328498 A1  Oct. 15, 2020

Related U.S. Application Data

(60) Provisional application No. 62/834,148, filed on Apr. 15, 2019.

(51) Int. Cl.
*H01Q 1/22* (2006.01)
*H01L 23/522* (2006.01)
*H01L 23/66* (2006.01)
*H01L 23/528* (2006.01)
*H01L 21/306* (2006.01)
*H01L 21/288* (2006.01)
*H01Q 9/16* (2006.01)
*H01L 23/532* (2006.01)

(52) U.S. Cl.
CPC ........ *H01Q 1/2283* (2013.01); *H01L 21/288* (2013.01); *H01L 21/30604* (2013.01); *H01L 23/528* (2013.01); *H01L 23/5226* (2013.01); *H01L 23/66* (2013.01); *H01L 23/53223* (2013.01); *H01L 23/53238* (2013.01); *H01L 23/53266* (2013.01); *H01L 2223/6616* (2013.01); *H01L 2223/6677* (2013.01); *H01Q 9/16* (2013.01)

(58) Field of Classification Search
CPC ...... H01Q 1/2283; H01Q 9/16; H01L 21/288; H01L 21/30604; H01L 23/5226; H01L 23/528; H01L 23/66; H01L 23/53223; H01L 23/53238; H01L 23/53266; H01L 2223/6616; H01L 2223/6677
USPC ........................................................ 257/774
See application file for complete search history.

(56) References Cited

U.S. PATENT DOCUMENTS

| | | |
|---|---|---|
| 4,287,518 A | 9/1981 | Ellis, Jr. |
| 6,096,621 A | 8/2000 | Jennings |

(Continued)

OTHER PUBLICATIONS

Jameson et al., *A 300GHz Wirelessly Locked 2x3 Array Radiating 5.4dBm with 5.1% DC-to-RF Efficiency in 65nm CMOS*, ISSCC 2016, Session 20, 20.4, 3 pages.

(Continued)

*Primary Examiner* — Tu-Tu V Ho
(74) *Attorney, Agent, or Firm* — Patent Capital Group

(57) ABSTRACT

One embodiment is an apparatus comprising a silicon-on-insulator ("SOI") substrate comprising an insulating layer sandwiched in between a bottom silicon layer and a top silicon layer; a radiating element disposed on a top surface of the SOI substrate; and at least one cavity disposed in the SOI substrate surrounding the radiating element, wherein the at least one cavity extends from a bottom surface of the bottom silicon layer to a bottom surface of the insulating layer.

27 Claims, 7 Drawing Sheets

(56) References Cited

U.S. PATENT DOCUMENTS

| | | | |
|---|---|---|---|
| 7,622,778 B2 | 11/2009 | Lee et al. | |
| 7,911,044 B2 | 3/2011 | Yang et al. | |
| 2004/0252065 A1* | 12/2004 | Agnese | G01J 5/08 |
| | | | 343/703 |
| 2018/0048048 A1 | 2/2018 | Socher et al. | |
| 2020/0218012 A1* | 7/2020 | Wang | G02B 6/34 |

OTHER PUBLICATIONS

Zhang et al., *Antenna-on-Chip and Antenna-in-Package Solutions to Highly Integrated Millimeter-Wave Devices for Wireless Communications*, IEEE Transactions on Antennas and Propagation, vol. 57, No. 10, Oct. 2009, 12 pages.

Pan et al., *Design of a CMOS On-Chip Slot Antenna With Extremely Flat Cavity at 140 GHz*, IEEE Antennas and Wireless Propagation Letters, vol. 10, 2011, 4 pages.

Grzyb et al., *Lens-integrated on-chip antennas for THz direct detectors in SiGe HBT Technology*, 978-1-4673-5317 © 2013 IEEE, 2 pages.

Adela et al., *On-Chip Antenna Integration for Millimeter-Wave Single-Chip FMCW Radar, Providing High Efficiency and Isolation*, IEEE Transactions on Antennas and Propagation, vol. 64, No. 8, Aug. 2016, 11 pages.

* cited by examiner

SILICON CAVITY BACKED RADIATOR STRUCTURE

CROSS-REFERENCE TO RELATED APPLICATION

This patent application claims the benefit of the filing date of U.S. Provisional Patent Application Ser. No. 62/834,148, filed on Apr. 15, 2019, and entitled "SILICON CAVITY BACKED RADIATOR STRUCTURE," the content of which is hereby expressly incorporated by reference.

FIELD OF THE DISCLOSURE

This disclosure relates generally to the field of integrated circuit ("IC") devices and, more particularly, to a silicon cavity backed radiator structure for use in connection with IC devices.

SUMMARY OF THE DISCLOSURE

One embodiment is an apparatus comprising a silicon-on-insulator ("SOI") substrate comprising an insulating layer disposed between a bottom silicon layer and a top silicon layer; a radiating element disposed on a top surface of the SOI substrate; and at least one cavity disposed in the SOI substrate surrounding the radiating element; wherein the at least one cavity extends from a bottom surface of the bottom silicon layer to a bottom surface of the insulating layer. In certain embodiments, the at least one cavity may be etched into the SOI substrate and the insulating layer may function as an etch-stop layer. The at least one cavity may be metal-plated and a bottom surface of the SOI substrate may also be metal plated. Embodiments may further include a capacitively-coupled electrical connection being created between a ground of the radiating element and the at least one cavity. The radiating element may include an array of radiating elements and the at least one cavity may include a plurality of at least one cavities surrounding each of the radiating elements of the array of radiating elements individually. The at least one cavity may comprise a trench or a plurality of vias.

Another embodiment is a method comprising etching at least one cavity into a bottom surface of a silicon-on-insulator ("SOI") substrate, wherein the at least one cavity is etched around a perimeter of a radiating element area disposed on a top surface of the SOI substrate and wherein an insulator layer of the SOI substrate functions as an etch stop to prevent the at least one cavity from penetrating the insulator layer such that the at least one cavity extends only through a bottom silicon layer of the SOI substrate; and plating an inside of the at least one cavity with metal to form a dielectrically-loaded cavity. The method may further include filling the metal-plated at least one cavity with a dielectric material and/or plating the bottom surface of the SOI substrate with metal simultaneously with the plating the inside of the at least one cavity with metal.

The method may further include creating a capacitively-coupled electrical connection between a ground of the radiating element and the metal-plated at least one cavity. Additionally, the method may further include creating a capacitively-coupled electrical connection by creating at least one via from the ground of the radiating element to a first metal layer disposed on the top surface of the SOI substrate directly above the metal-plated at least one cavity. The at least one cavity may comprise a trench and/or a plurality of vias.

Yet another embodiment is an integrated circuit device comprising a silicon-on-insulator ("SOI") substrate comprising an insulating layer disposed between first and second silicon layers, the insulating layer comprising an etch stop layer; an antenna disposed on a top surface of the SOI substrate; at least one cavity etched into a bottom surface the SOI substrate surrounding the antenna, wherein the at least one cavity extends from the bottom surface of the SOI substrate to a bottom surface of the insulating layer; and a metal layer disposed over a bottom surface of the SOI substrate; wherein a capacitively-coupled electrical connection is created between a ground of the antenna and the at least one cavity. The at least one cavity may be metal-plated. Additionally, the antenna may include an array of antennas and the at least one cavity may include a plurality of at least one cavities surrounding each of the antennas of the array of antennas individually. The at least one cavity may comprise a trench and/or a plurality of vias.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
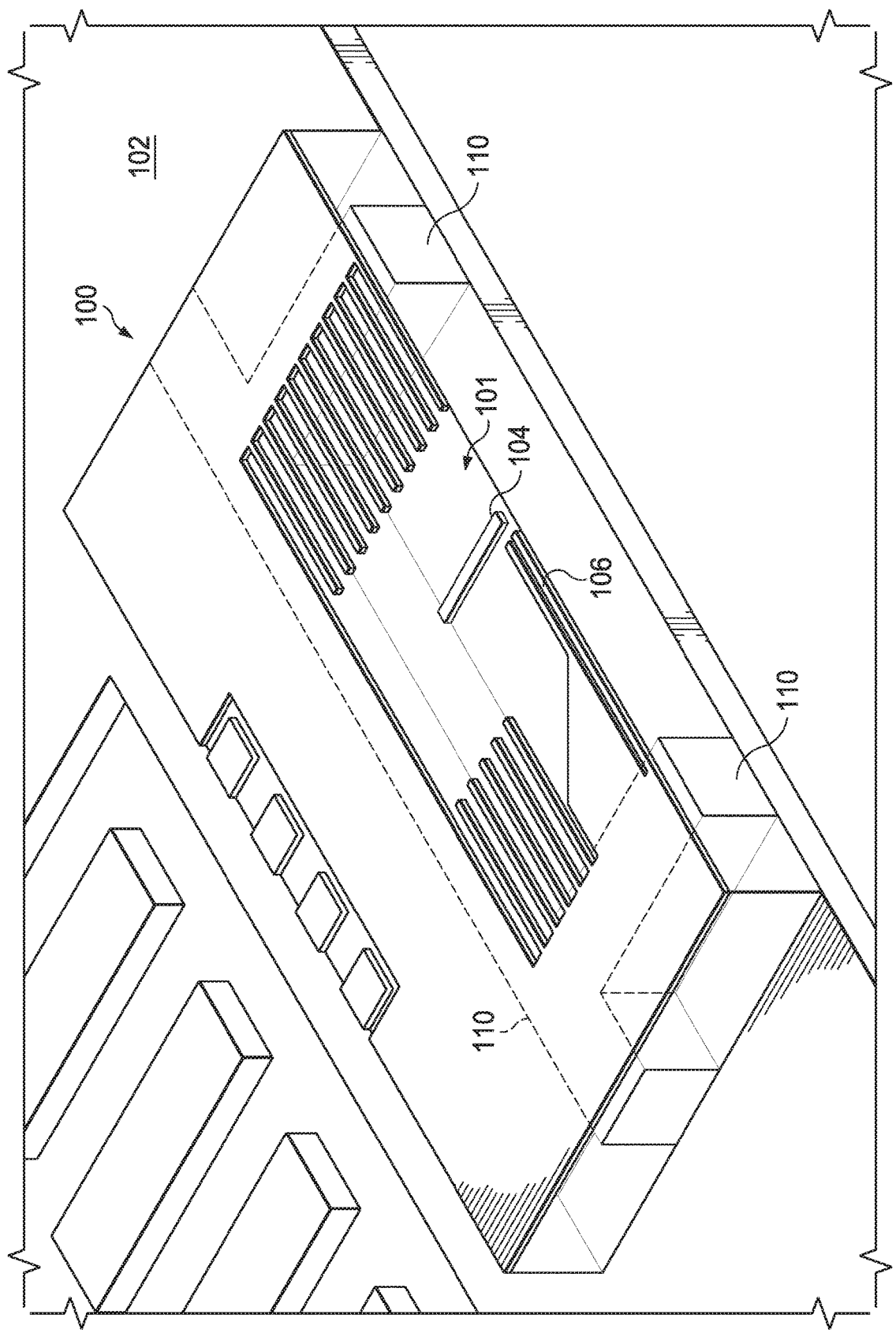
FIG. 1 is perspective cutaway view of an IC device having a silicon cavity backed radiator structure in accordance with features of embodiments described herein and disposed on a printed circuit board.

Integrating radiating elements, such as antennas, into IC devices presents a variety of challenges. For example, due to the high dielectric constant of silicon, radiation from a radiating element is easily trapped in the silicon substrate, where high-conductivity results in excessive loss. A high-resistivity substrate may be used to reduce losses, but a collateral result is that the energy radiates out the edges of the IC, which is not the intended direction of radiation.

Techniques to improve efficiency of on-chip radiators have been employed and have included the addition of lenses and/or superstrates. Superstrates include a layer of material placed on top of a silicon die with a dielectric constant larger than that of air and can provide a transition to air, thereby improving radiation. Quartz with a thickness of approximate a quarter wavelength is typically used in constructing superstrates. Such approaches can work, but are not standard semiconductor processing techniques, which limits their practicality and increases fabrication costs. Other techniques have included constructing a cavity in the metal layers above the silicon substrate, but such cavities are necessarily very thin (e.g., less than or equal to approximately 20 μm) and therefore do not offer high efficiency, since to be efficient, a cavity needs to be at least a quarter wavelength (¼ λ) thick. For example, ¼ λ in silicon at 140 GHz is approximately 150 μm. Still other techniques have included constructing a cavity in the PCB under the die. This technique can also work; however, the gap to the cavity is limited by the die thickness and would be lossy unless a high-resistivity substrate is used.

Embodiments described herein comprise techniques to construct cavity backed radiating elements into an IC device with high radiation efficiency manufacturable using standard IC processing techniques. The cavity effectively isolates the radiating element, which may be, for example, an antenna, from the surrounding environment, allowing for integrated arrays. The cavity also reduces sensitivity of the radiating element to the surrounding environment, such as the IC package and/or a printed circuit board ("PCB") on which the IC is disposed.

In accordance with features of certain embodiments described herein, a cavity is constructed in a silicon-on-insulator ("SOI") process by first defining a cavity in the substrate by etching trenches into the back of the silicon substrate around the perimeter of a radiating element disposed on the substrate, wherein the buried oxide layer functions as an "etch stop." After etching the trench box below/around the radiating element, the trenches and the back side of the IC may be plated with metal, such as copper, to form a dielectrically loaded cavity. The trench may then be filled with a dielectric for mechanical stability. The substrate may preferably be constructed of a high-resistivity (e.g., 1 kOhm-cm) material to further reduce losses associated with the dielectrically loaded cavity. Additionally, the antenna ground on the IC is brought down to the first metal layers using vias directly above the metal trench to form a capacitively-coupled electrical connection between the antenna ground and the metalized cavity, or trench.

SOI technology involves the use of a layered silicon-insulator-silicon substrate in place of a conventional all-silicon substrate in semiconductor manufacturing. SOI technology reduces parasitic device capacitance, thereby improving overall performance. SOI-based devices differ from conventional silicon-only devices in that the silicon junction is disposed above an insulator (e.g., silicon dioxide or sapphire). From a manufacturing perspective, SOI substrates are compatible with most conventional fabrication processes, such that an SOI-based process may be implemented without special equipment or significant retooling of an existing factory.

FIG. 1 is a perspective cutaway view of cutaway view of an IC device (IC 100) comprising an SOI-based device including a silicon cavity backed radiating device 101 in accordance with features of embodiments described herein. As shown in FIG. 1, the IC 100 is mounted on a PCB 102. Although only half of the IC 100 is shown in FIG. 1, the device is symmetrical and therefore the portion of the device not shown in FIG. 1 is a mirror image of the portion shown. The radiating device 101, which is illustrated in FIG. 1 as a dipole antenna 104 having an associated antenna feed 106 (only half of which is shown in FIG. 1, as noted above), is disposed on a top surface of the IC 100.

Figure 2:
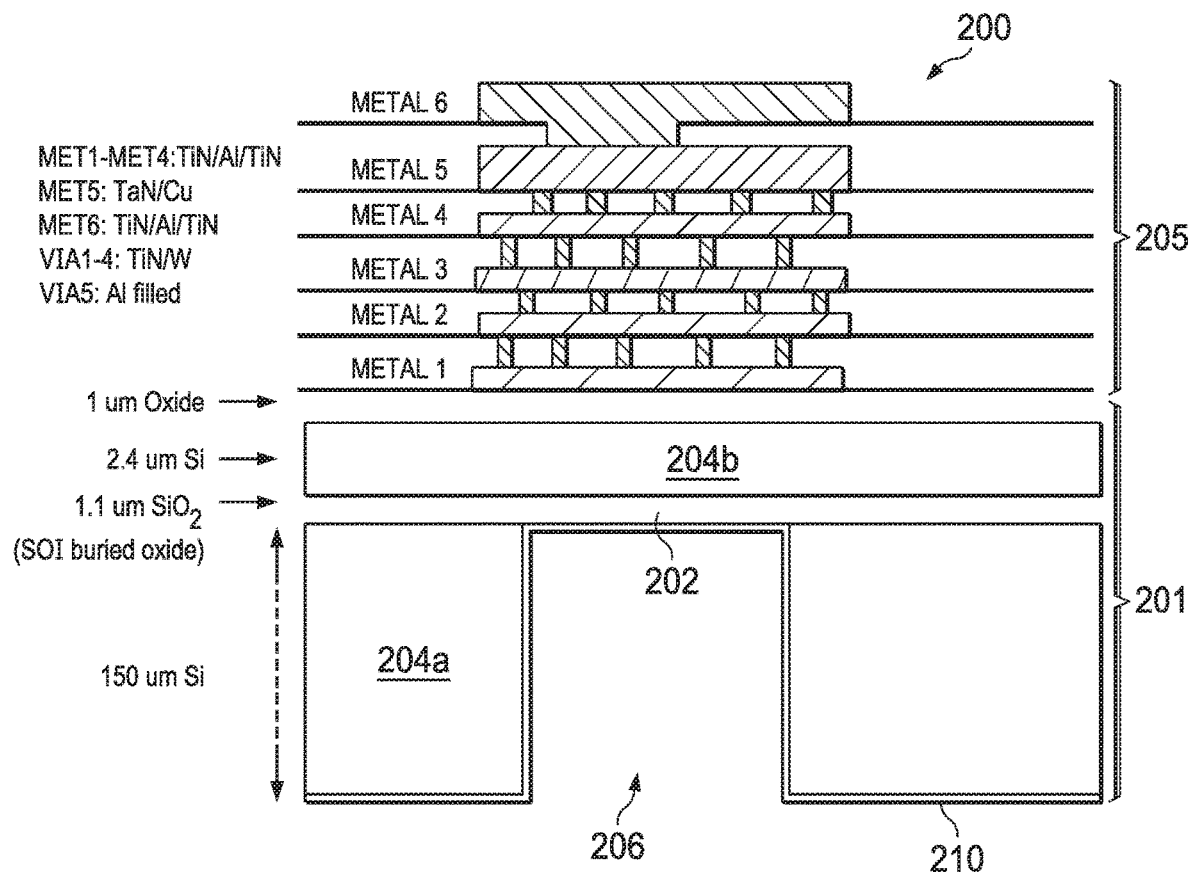
FIG. 2 illustrates a side cutaway plan view of an IC device having a silicon cavity backed radiator structure in accordance with features of embodiments described herein.

In accordance with features of embodiments described herein, a metal-plated square-shaped cavity, or trench, 110 is disposed on a back side of the IC 100 and extends part-way through the IC upwards toward the front side thereof and around the perimeter of the radiating device 101. In particular, as best illustrated in FIG. 2, the trench 110 does not extend upwards beyond an oxide layer of the IC device 100. Although only half of the trench is illustrated in FIG. 1, it will be recognized that the trench comprises a rectangular shape disposed around a perimeter of the antenna 104. In one embodiment, and for purposes of example only, the IC measures 1.5 mm×1.5 mm, the antenna measures 420 μm×20 μm, and the PCB ground measures 34.4 mm×34.4 mm. The trench 110 is 150 μm wide, 150 μm high, and an inner area thereof is 800 μm×1000 μm. An M6 opening of the cavity is 700 μm×900 μm and a corrugated M6 opening of the cavity is 700 μm×340 μm. It will be recognized that while a number of specific measurements are provided, that the actual size of the trench 110 will be dictated by the size necessary to ensure optimal efficiency of the antenna at a particular frequency or range of frequencies.

Figure 3:
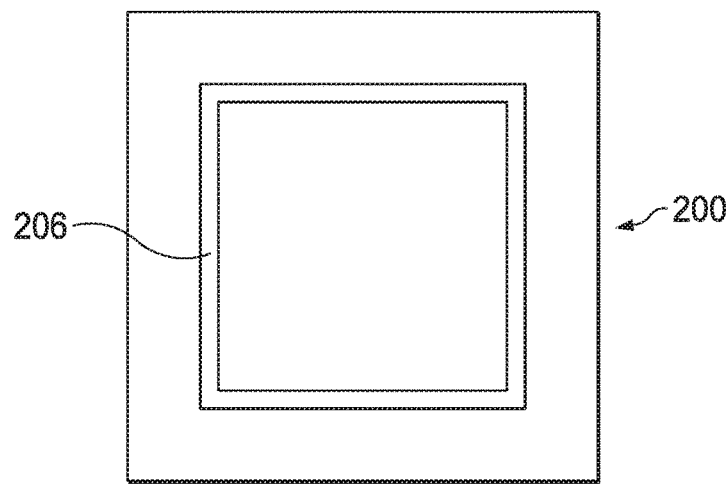
FIG. 3 is a schematic view of a back side of the IC device of FIG. 2 showing a plurality of metal-plated trenches disposed therein.

Referring now to FIG. 2, illustrated therein is a side plan view of an IC device 200 having a silicon cavity backed radiator structure in accordance with features of embodiments described herein and disposed on a printed circuit board. As shown in FIG. 2, the IC 200 is an SOI-based device and includes a substrate 201 including an insulating layer (e.g., $SiO_2$) 202 sandwiched between two silicon layers 204a, 204b. A plurality of metal layers 205 are disposed on a top layer of the substrate 201 using any one or more of a variety of techniques and comprise various active and other components of the IC 200, including a radiating element, such as radiating device 101 (FIG. 1). As shown in FIG. 2, a trench 206 is etched into the back side of the substrate 201. In particular, the trench 206 extends through the silicon layer 204a to the back side of the insulating layer 202. In accordance with features of embodiments described herein, the trench 206 does not extend through the insulating layer 202 or the silicon layer 204b. The inside of the trench 206, as well as the back side of the substrate 201, is plated with metal 210. FIG. 3 illustrates a bottom plan view of the IC device 200 showing the metal plated trench 206. In some embodiments, an interior of the metal plated trench may be further filled with a dielectric material to provide mechanical and structural stability to the device.

Figure 4:
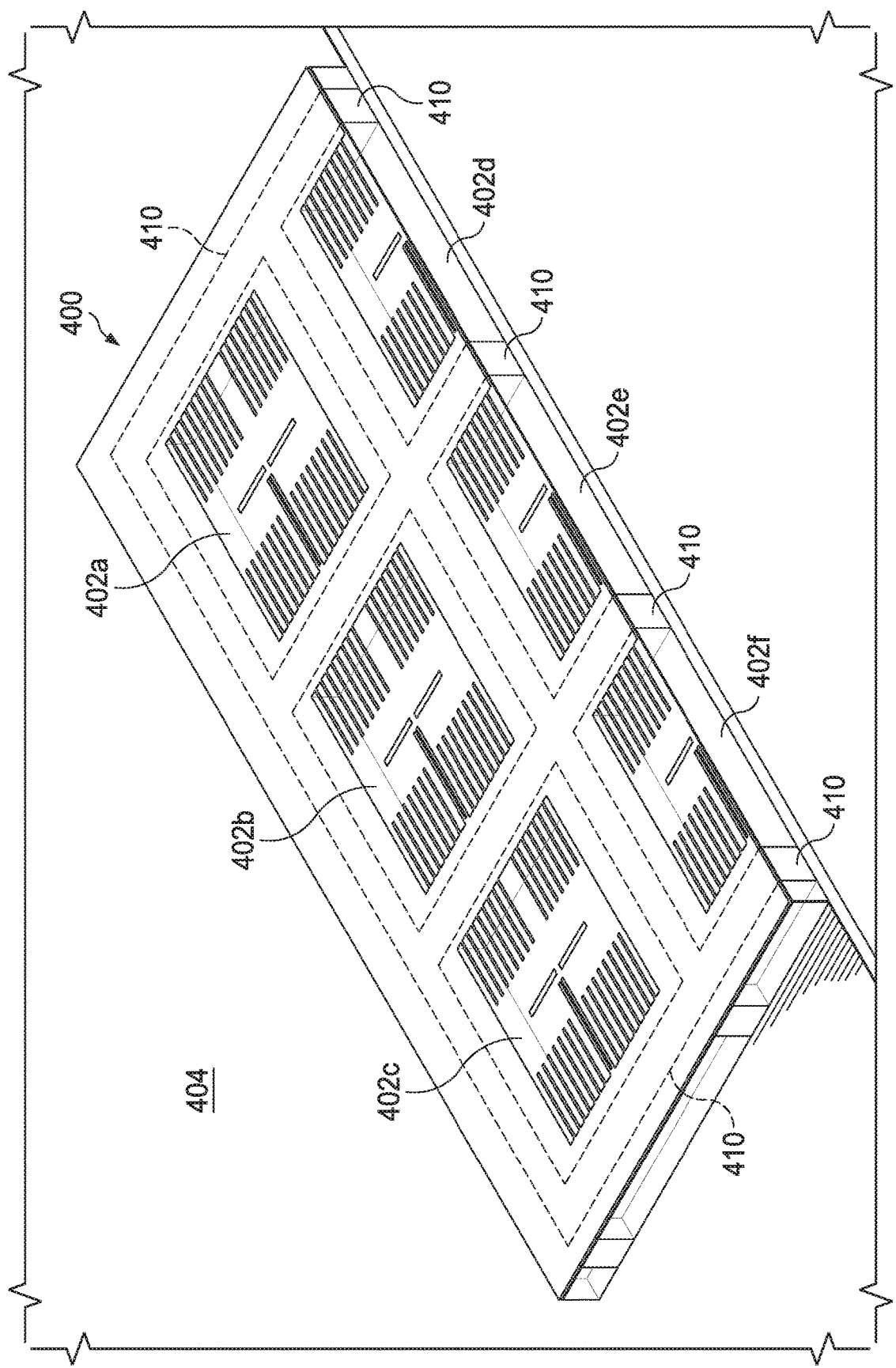
FIG. 4 is a perspective cutaway view of an IC device including an array of silicon cavity backed radiator structures in accordance with features of embodiments describe herein and disposed on a printed circuit board.

FIG. 4 is a perspective cutaway view of an IC device 400 including an array of silicon cavity backed radiating devices 402a-402f in accordance with features of embodiments describe herein and disposed on a printed circuit board 404. The devices 402a-402f may be similar or identical to one another and may be similar or identical to the radiating device 101 shown and described with reference to FIG. 1. In accordance with features of embodiments described herein, a plurality of metal-plated square-shaped cavities, or trenches, 410 are disposed on a back side of the IC 400 and extend part-way through the IC upwards toward the front side thereof and around the perimeters of the radiating devices 402a-402f such that each of the devices is surrounded at its perimeter by a trench. It will be noted that adjacent devices may share a trench or a portion of a trench. Again, as best illustrated in FIG. 2, the trenches 410 do not extend upwards beyond an oxide layer of the IC device 400.

In one embodiment, and for purposes of example only, the IC measures 3.8 mm×3.8 mm, the antenna measures 420 μm×20 μm, and the PCB ground measures 34.4 mm×34.4 mm. The trench 110 is 150 μm wide, 150 μm high, and an inner area thereof is 800 μm×1000 μm. An M6 opening of the cavity is 700 μm×900 μm and a corrugated M6 opening of the cavity is 700 μm×340 μm. It will be recognized that while a number of specific measurements are provided, that the actual size of the trench 110 will be dictated by the size necessary to ensure optimal efficiency of the antenna at a particular frequency or range of frequencies.

Figure 5:
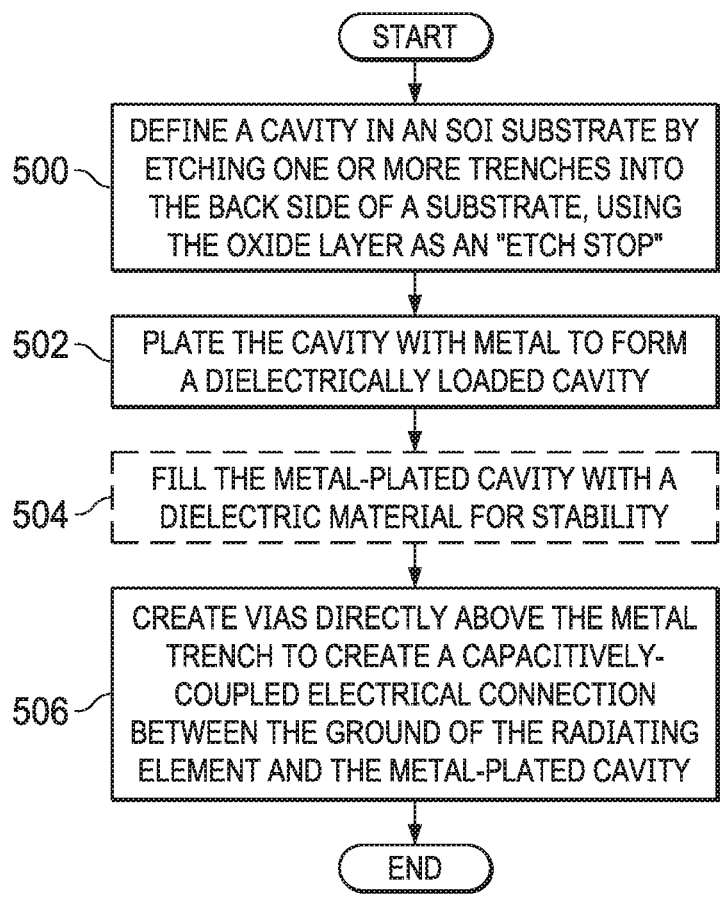
FIG. 5 is a flowchart illustrating a process for manufacturing an IC device such as the IC device illustrated in FIG. 1 and the IC device illustrated in FIG. 4 in accordance with features of embodiments described herein.

Referring now to FIG. 5, illustrated therein is a flowchart illustrating a process for manufacturing an IC device such as the IC device illustrated in FIG. 1 and the IC device illustrated in FIG. 4 in accordance with features of embodiments described herein. As shown in FIG. 5, in step 500, a cavity, or trench, is etched into the back side of an SOI substrate. In accordance with features described herein, the buried oxide layer of the SOI substrate functions as an "etch stop" such that the etching process, and hence the trench, does not penetrate the buried oxide layer, as shown in FIG. 5. As also shown in FIG. 5, the trench is etched below an area where a radiating element is or will be disposed on a top surface of the substrate. Typically, the trench is etched after the wafer is processed to add the diffusion and metal layers on the top side of the wafer. It is possible to etch the trench first, but then the wafer is mechanically more fragile and likely to warp or crack during handling and under high temperatures necessary for diffusions, In step 502, after the trench has been etched, the trench (and optionally the back side of the IC) are plated with metal, which in certain embodiments is copper, to form a dielectrically loaded cavity. In optional step 504, the metal-plated trench may be further filled with a dielectric material for providing mechanical stability to the IC. The substrate preferably be constructed of a high-resistivity (e.g., 1 kOhm-cm) material to further reduce losses associated with the dielectrically loaded cavity. Additionally, in step 506, the ground of the radiating element on the IC brought down to the first metal layers using vias directly above the metal-plated trench to form a capacitively-coupled electrical connection between the antenna ground and the metalized cavity, or trench. It will be noted that step 506 may be performed as part of the normal IC processing and may be accomplished prior to step 500. As best shown in FIG. 2, the capacitive coupling occurs between the top surface of the trench and the M1 layer.

Figure 6:
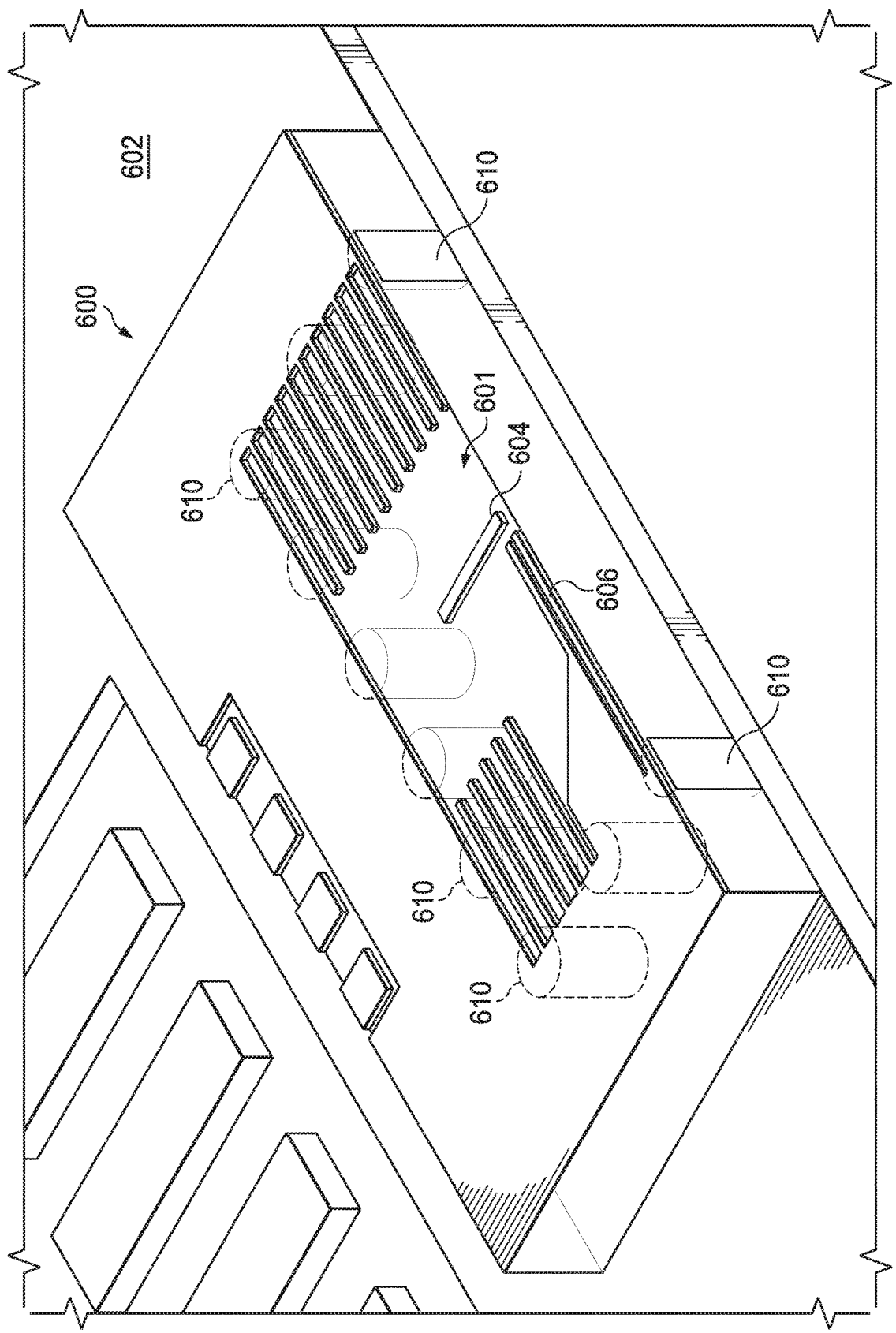
FIG. 6 is perspective cutaway view of an IC device having a silicon cavity backed radiator structure in accordance with features of alternative embodiments described herein and disposed on a printed circuit board.

In accordance with features of alternative embodiments described herein, the metal-plated square-shaped cavity, or trench, 110 (FIG. 1) is replaced with a plurality of vias disposed on a back side of an IC and extending part-way through the IC upwards toward the front side thereof and around the perimeter of the radiating device. FIG. 6 is a perspective cutaway view of cutaway view of such an alternative embodiment of an IC device, designated in FIG. 6 by a reference numeral 600, comprising an SOI-based device including a silicon cavity backed radiating device 601 in accordance with features of embodiments described herein. As shown in FIG. 6, the IC 600 is mounted on a PCB 602. Although only half of the IC 600 is shown in FIG. 6, the device is symmetrical and therefore the portion of the device not shown in FIG. 6 is a mirror image of the portion shown. The radiating device 601, which is illustrated in FIG. 6 as a dipole antenna 604 having an associated antenna feed 606 (only half of which is shown in FIG. 6, as noted above), is disposed on a top surface of the IC 600.

Figure 7:
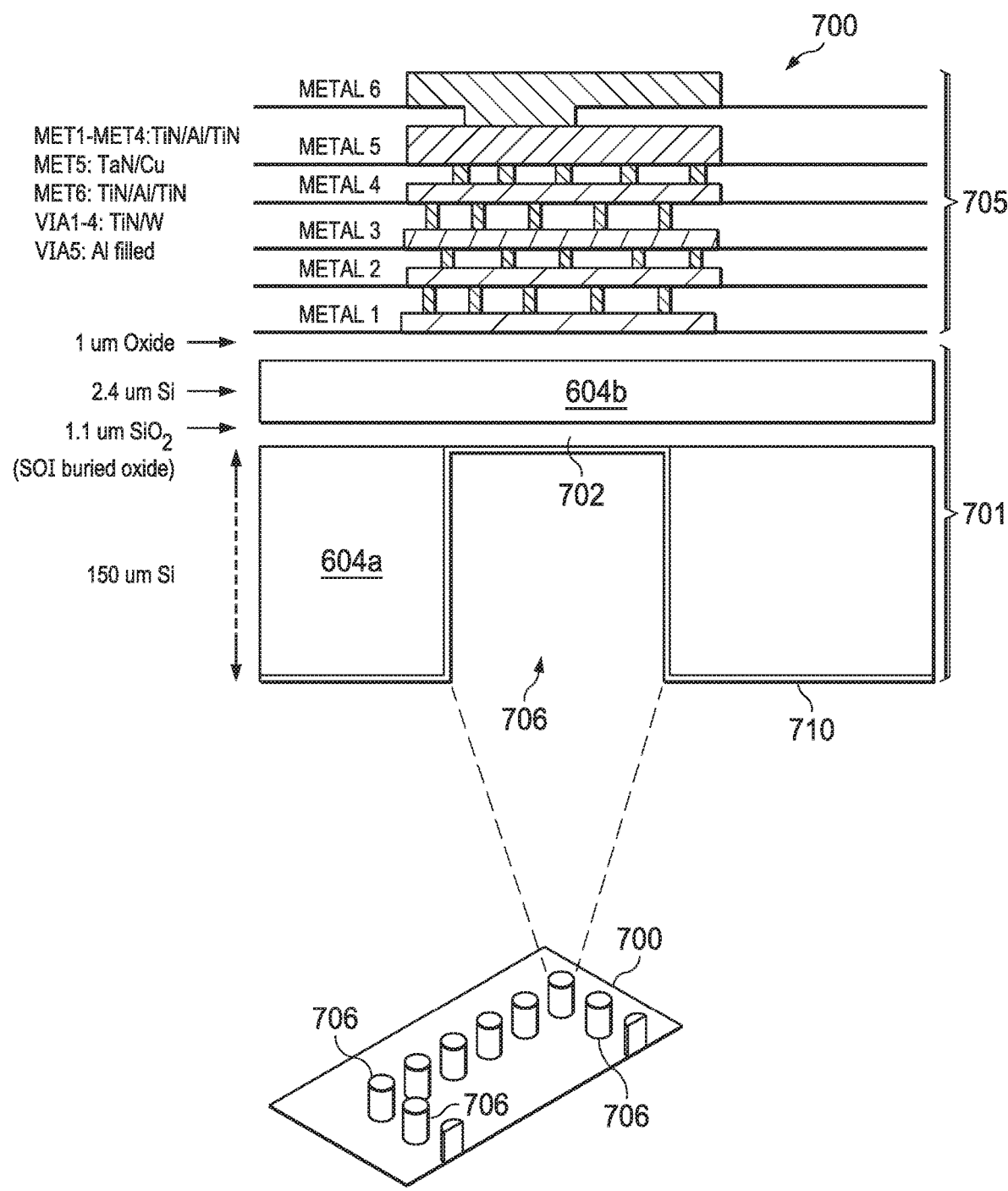
FIG. 7 illustrates a side cutaway plan view of an IC device having a silicon cavity backed radiator structure in accordance with features of alternative embodiments described herein.

In accordance with features of embodiments described herein, a plurality of metal-plated cylinder-shaped cavities, or vias 610, are disposed on a back side of the IC 600 and extends part-way through the IC upwards toward the front side thereof and around the perimeter of the radiating device 601. In particular, as best illustrated in FIG. 7, the vias do not extend upwards beyond an oxide layer of the IC device 600. Although only half of the vias 610 are illustrated in FIG. 6, it will be recognized that the vias are disposed around a perimeter of the antenna 604. In one embodiment, and for purposes of example only, the IC measures 1.5 mm×1.5 mm, the antenna measures 420 μm×20 μm, and the PCB ground measures 34.4 mm×34.4 mm. In certain embodiments, each via is approximately 100 μm in diameter, approximately 150 μm high, are spaced approximately 200 μm (center to center) apart, and disposed approximately 50 μm from the edge of the die. The metal thickness is approximately 10 μm. An M6 opening of the cavity is 700 μm×900 μm and a corrugated M6 opening of the cavity is 700 μm×340 μm. It will be recognized that while a number of specific measurements are provided, that the actual size and number of vias 610 will be dictated by the size necessary to ensure optimal efficiency of the antenna at a particular frequency or range of frequencies.

One critical dimension is wafer thickness, which needs to be close to 0.25 wavelengths in the silicon, or approximately 150 μm at 140 GHz. Another critical dimension is that the via-to-via spacing needs to be small relative to a wavelength. In embodiments described herein, the via-to-via spacing is less than 0.5 wavelengths.

FIG. 7 illustrates a side plan view of an IC device 700 having a silicon cavity backed radiator structure in accordance with features of alternative embodiments described herein and disposed on a printed circuit board. As shown in FIG. 7, the IC 700 is an SOI-based device and includes a substrate 701 including an insulating layer (e.g., SiO$_2$) 702 sandwiched between two silicon layers 604a, 604b. A plurality of metal layers 705 are disposed on a top layer of the substrate 701 using any one or more of a variety of techniques and comprise various active and other components of the IC 700, including a radiating element, such as radiating device 601 (FIG. 6). As shown in FIG. 7, each of a plurality of vias (represented in FIG. 7 by vias 706) is etched into the back side of the substrate 701. In particular, the via 706 extends through the silicon layer 604a to the back side of the insulating layer 702. In accordance with features of embodiments described herein, the vias 706 ds not extend through the insulating layer 702 or the silicon layer 604b. The inside of each of the vias 706, as well as the back side of the substrate 701, is plated with metal 710. As previously noted, as with the trench 110 (FIG. 1), vias 706 are provided around the perimeter of the radiating device (not shown in FIG. 7).

Figure 8:
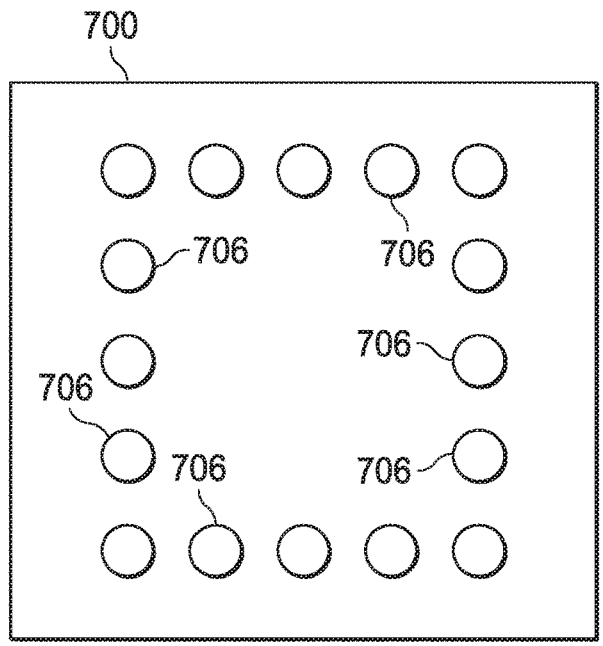
FIG. 8 is a schematic view of a back side of the IC device of FIG. 7 showing a plurality of metal-plated trenches disposed therein.

FIG. 8 illustrates a bottom plan view of the IC device 700 showing the metal plated vias 706. In some embodiments, an interior of the metal plated trench may be further filled with a dielectric material to provide mechanical and structural stability to the device.

It will be recognized that the alternative embodiment illustrated in FIGS. 6-8 may be used to create an array of silicon cavity backed radiating devices as shown in FIG. 4. In particular, in accordance with features of alternative embodiments described herein, the plurality of metal-plated square-shaped cavities, or trenches, 410 disposed on a back side of the IC 400 and extending part-way through the IC upwards toward the front side thereof and around the perimeters of the radiating devices 402a-402f such that each of the devices is surrounded at its perimeter by a trench may be replaced by a plurality of vias arranged in the same shape as the trench (i.e., in a rectangle disposed around a perimeter of the radiating element). It will be noted that adjacent devices may share one or more vias or portions of vias.

Figure 9:
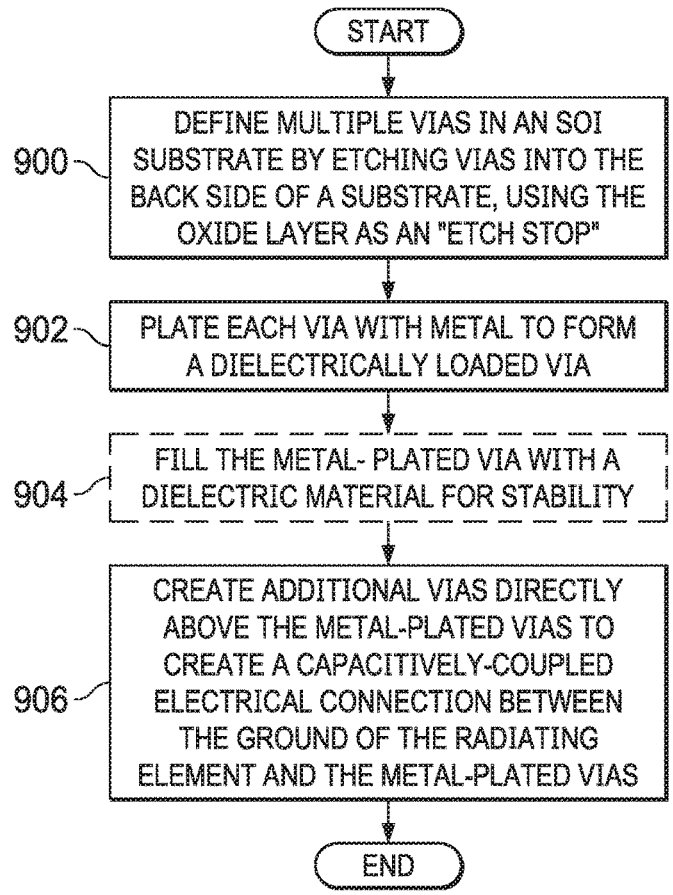
FIG. 9 is a flowchart illustrating a process for manufacturing an IC device such as the IC device illustrated in FIG. 6 in accordance with features of alternative embodiments described herein.

Referring now to FIG. 9, illustrated therein is a flowchart illustrating a process for manufacturing an IC device such as the IC device illustrated in FIGS. 6-8 in accordance with features of alternative embodiments described herein. As shown in FIG. 9, in step 900, a plurality of vias are etched into the back side of an SOI substrate. In accordance with features described herein, the buried oxide layer of the SOI substrate functions as an "etch stop" such that the etching process, and hence the vias, do not penetrate the buried oxide layer, as shown in FIG. 7. As previously described, the vias are etched below an area where a radiating element is or will be disposed on a top surface of the substrate. Typically, the vias are etched after the wafer is processed to add the diffusion and metal layers on the top side of the wafer. It is possible to etch the vias first, but then the wafer is mechanically more fragile and likely to warp or crack during handling and under high temperatures necessary for diffusions. In step 902, after the vias have been etched, the vias (and optionally the back side of the IC) are plated with metal, which in certain embodiments is copper, to form a dielectrically loaded cavity. In optional step 904, the metal-plated vias may be further filled with a dielectric material for providing mechanical stability to the IC. The substrate preferably be constructed of a high-resistivity (e.g., 1 kOhm-cm) material to further reduce losses associated with the dielectrically loaded cavity. Additionally, in step 906, the ground of the radiating element on the IC brought down to the first metal layers using vias directly above the metal-plated trench to form a capacitively-coupled electrical connection between the antenna ground and the metalized cavity, or trench. It will be noted that step 906 may be performed as part of the normal IC processing and may be accomplished prior to step 900. As best shown in FIG. 7, the capacitive coupling occurs between the top surface of the vias and the M1 layer.

Example 1 is an apparatus comprising a silicon-on-insulator ("SOI") substrate comprising an insulating layer disposed between a bottom silicon layer and a top silicon layer; a radiating element disposed on a top surface of the SOI substrate; and at least one cavity disposed in the SOI substrate surrounding the radiating element; wherein the at least one cavity extends from a bottom surface of the bottom silicon layer to a bottom surface of the insulating layer.

In Example 2, the apparatus of Example 1 may further include the at least one cavity being etched into the SOI substrate and the insulating layer functioning as an etch-stop layer.

In Example 3, the apparatus of any of Examples 1-2 may further include the at least one cavity being metal-plated.

In Example 4, the apparatus of any of Examples 1-3 may further include a bottom surface of the SOI substrate being metal plated.

In Example 5, the apparatus of any of Examples 1-4 may further include a capacitively-coupled electrical connection being created between a ground of the radiating element and the at least one cavity.

In Example 6, the apparatus of any of Examples 1-5 may further include the radiating element comprising an array of radiating elements and the at least one cavity comprising a plurality of at least one cavities surrounding each of the radiating elements of the array of radiating elements individually.

In Example 7, the apparatus of any of Examples 1-6 may further include the at least one cavity comprising a trench.

In Example 8, the apparatus of any of Examples 1-7 may further include the at least one cavity comprising a plurality of vias.

Example 9 is a method comprising etching at least one cavity into a bottom surface of a silicon-on-insulator ("SOI") substrate, wherein the at least one cavity is etched around a perimeter of a radiating element area disposed on a top surface of the SOI substrate and wherein an insulator layer of the SOI substrate functions as an etch stop to prevent the at least one cavity from penetrating the insulator layer such that the at least one cavity extends only through a bottom silicon layer of the SOI substrate; and plating an inside of the at least one cavity with metal to form a dielectrically-loaded cavity.

In Example 10, the method of Example 9 may further include filling the metal-plated at least one cavity with a dielectric material.

In Example 11, the method of any of Examples 9-10 may further include plating the bottom surface of the SOI substrate with metal simultaneously with the plating the inside of the at least one cavity with metal.

In Example 12, the method of any of Examples 9-11 may further include creating a capacitively-coupled electrical connection between a ground of the radiating element and the metal-plated at least one cavity.

In Example 13, the method of any of Examples 9-12 may further include the creating a capacitively-coupled electrical connection including creating at least one via from the ground of the radiating element to a first metal layer disposed on the top surface of the SOI substrate directly above the metal-plated at least one cavity.

In Example 14, the method of any of Examples 9-13 may further include the at least one cavity comprising a trench.

In Example 15, the method of any of Examples 9-14 may further include the at least one cavity comprises a plurality of vias.

Example 16 is an integrated circuit device comprising a silicon-on-insulator ("SOI") substrate comprising an insulating layer disposed between first and second silicon layers, the insulating layer comprising an etch stop layer; an antenna disposed on a top surface of the SOI substrate; at least one cavity etched into a bottom surface the SOI substrate surrounding the antenna, wherein the at least one cavity extends from the bottom surface of the SOI substrate to a bottom surface of the insulating layer; and a metal layer disposed over a bottom surface of the SOI substrate; wherein a capacitively-coupled electrical connection is created between a ground of the antenna and the at least one cavity.

In Example 17, the integrated circuit device of Example 16 may further include the at least one cavity being metal-plated.

In Example 18, the integrated circuit device of any of Examples 16-17 may further include the antenna including an array of antennas and the at least one cavity comprises a plurality of at least one cavities surrounding each of the antennas of the array of antennas individually.

In Example 19, the integrated circuit device of any of Examples 16-18 may further include the at least one cavity comprising a trench.

In Example 20, the integrated circuit device of any of Examples 16-19 may further include the at least one cavity comprising a plurality of vias.

Embodiments described herein comprising metalized silicon cavity backed radiator structures are effective to constrain electromagnetic fields, prevent surface wave modes, provide better thermal properties, and enable a smaller antenna size.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The "means for" in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims;

and (b) does not intend, by any statement in the specification, to limit this disclosure in any way that is not otherwise reflected in the appended claims.

What is claimed is:

1. An apparatus comprising:
   a silicon-on-insulator ("SOI") substrate comprising an insulating layer between a bottom silicon layer and a top silicon layer;
   a radiating element on a top surface of the SOI substrate; and
   at least one cavity in the SOI substrate surrounding the radiating element; and
   wherein the at least one cavity comprises a plurality of vias extending from a bottom surface of the bottom silicon layer to a bottom surface of the insulating layer.

2. The apparatus of claim 1, wherein the at least one cavity is etched into the SOI substrate and wherein the insulating layer comprises an etch-stop layer.

3. The apparatus of claim 1, wherein the at least one cavity is metal-plated.

4. The apparatus of claim 1, wherein the bottom surface of the SOI substrate comprises a metal layer.

5. The apparatus of claim 1 wherein a capacitively-coupled electrical connection is created between a ground of the radiating element and the at least one cavity.

6. The apparatus of claim 1, wherein the radiating element comprises an array of radiating elements and the at least one cavity comprises a plurality of at least one cavities surrounding each of the radiating elements of the array of radiating elements individually.

7. The apparatus of claim 1, wherein the at least one cavity comprises a trench.

8. The apparatus of claim 1, wherein at least a portion of the at least one cavity includes metal.

9. A method comprising:
   etching at least one cavity into a bottom surface of a silicon-on-insulator ("SOI") substrate, wherein the at least one cavity is etched around a perimeter of a radiating element area disposed on a top surface of the SOI substrate and wherein an insulator layer of the SOI substrate functions as an etch stop to prevent the at least one cavity from penetrating the insulator layer such that the at least one cavity extends only through a bottom silicon layer of the SOI substrate;
   plating at least a portion of an inside of the at least one cavity with metal to form a metal-plated at least one cavity; and
   at least partially filling the metal-plated at least one cavity with a dielectric material to form a dielectrically-loaded at least one cavity.

10. The method of claim 9 further comprising plating the bottom surface of the SOI substrate with metal simultaneously with the plating the inside of the at least one cavity with metal.

11. The method of claim 9 further comprising creating a capacitively-coupled electrical connection between a ground of the radiating element and the metal-plated at least one cavity.

12. The method of claim 11, wherein the creating a capacitively-coupled electrical connection comprises creating at least one via from the ground of the radiating element to a first metal layer disposed on the top surface of the SOI substrate directly above the metal-plated at least one cavity.

13. The method of claim 9, wherein the at least one cavity comprises a trench.

14. The method of claim 9, wherein the at least one cavity comprises a plurality of vias.

15. An integrated circuit device comprising:
    a silicon-on-insulator ("SOI") substrate comprising an insulating layer disposed between first and second silicon layers, the insulating layer comprising an etch stop layer;
    an antenna disposed on a top surface of the SOI substrate;
    at least one cavity etched into a bottom surface the SOI substrate surrounding the antenna, wherein the at least one cavity comprises a plurality of vias extending from the bottom surface of the SOI substrate to a bottom surface of the insulating layer; and
    a metal layer disposed over a bottom surface of the SOI substrate;
    wherein a capacitively-coupled electrical connection is created between a ground of the antenna and the at least one cavity.

16. The integrated circuit device of claim 15, wherein the at least one cavity is metal-plated.

17. The integrated circuit device of claim 15, wherein the antenna comprises an array of antennas and the at least one cavity comprises a plurality of at least one cavities surrounding each of the antennas of the array of antennas individually.

18. The integrated circuit device of claim 15, wherein the at least one cavity comprises a trench.

19. The integrated circuit device of claim 15, wherein at least a portion of the at least one cavity includes metal.

20. A microelectronic assembly comprising:
    a substrate;
    a radiating element on a first surface of the substrate; and
    at least one cavity in the substrate surrounding the radiating element; and
    wherein the at least one cavity comprises a plurality of vias extending into not through the substrate from a second surface of the substrate opposite the first surface of the substrate.

21. The microelectronic assembly of claim 20, wherein at least a portion of the at least one cavity is filled with metal.

22. The microelectronic assembly of claim 20, further comprising a metal layer over the second surface of the substrate.

23. The microelectronic assembly of claim 20 wherein a capacitively-coupled electrical connection is created between a ground of the radiating element and at least one of the plurality of vias.

24. The microelectronic assembly of claim 20, wherein the radiating element comprises a plurality of radiating elements and the at least one cavity comprises a plurality of cavities surrounding the plurality of radiating elements.

25. The microelectronic assembly of claim 24, wherein the plurality of radiating elements comprises an array of radiating elements.

26. The microelectronic assembly of claim 20, wherein the substrate comprises silicon.

27. The microelectronic assembly of claim 20, wherein the substrate comprises a semiconductor material.

* * * * *